United States Patent
Avraham

(10) Patent No.: US 7,424,659 B2
(45) Date of Patent: Sep. 9, 2008

(54) SYSTEM-IN-PACKAGE AND METHOD OF TESTING THEREOF

(75) Inventor: Meir Avraham, Rishon Lezion (IL)

(73) Assignee: Sandisk Il Ltd., Kfar-Saba (IL)

(*) Notice: Subject to any disclaimer, the term of this patent is extended or adjusted under 35 U.S.C. 154(b) by 346 days.

(21) Appl. No.: 10/697,981

(22) Filed: Oct. 31, 2003

(65) Prior Publication Data

US 2005/0149780 A1 Jul. 7, 2005

(51) Int. Cl.
*G01R 31/28* (2006.01)
*G11C 29/00* (2006.01)

(52) U.S. Cl. .................................. 714/742; 714/718
(58) Field of Classification Search ............... 714/30, 714/724, 718, 742; 716/4
See application file for complete search history.

(56) References Cited

U.S. PATENT DOCUMENTS

| | | | | |
|---|---|---|---|---|
| 4,333,142 A | * | 6/1982 | Chesley | 716/4 |
| 5,525,971 A | * | 6/1996 | Flynn | 714/724 |
| 5,566,303 A | * | 10/1996 | Tashiro et al. | 710/100 |
| 6,009,539 A | * | 12/1999 | Ranson | 714/30 |
| 6,151,692 A | * | 11/2000 | Smitlener et al. | 714/718 |
| 6,198,663 B1 | * | 3/2001 | Takizawa | 365/185.29 |
| 6,311,273 B1 | * | 10/2001 | Helbig, Sr. et al. | 726/2 |
| 6,347,056 B1 | * | 2/2002 | Ledford et al. | 365/201 |
| 6,636,825 B1 | * | 10/2003 | Malladi et al. | 702/118 |
| 6,832,348 B2 | * | 12/2004 | Kawabe et al. | 714/733 |

* cited by examiner

Primary Examiner—Cynthia Britt
(74) Attorney, Agent, or Firm—Mark M. Friedman

(57) ABSTRACT

A method of testing a SIP that has a CPU, a nonvolatile memory and a volatile memory. First, the CPU is used to test the memories. Then the CPU is tested separately. Preferably, the programs for testing the memories are pre-stored in and loaded from the nonvolatile memory into the volatile memory and are executed by the CPU in the volatile memory. Preferably, the test results are stored in the nonvolatile memory.

7 Claims, 1 Drawing Sheet

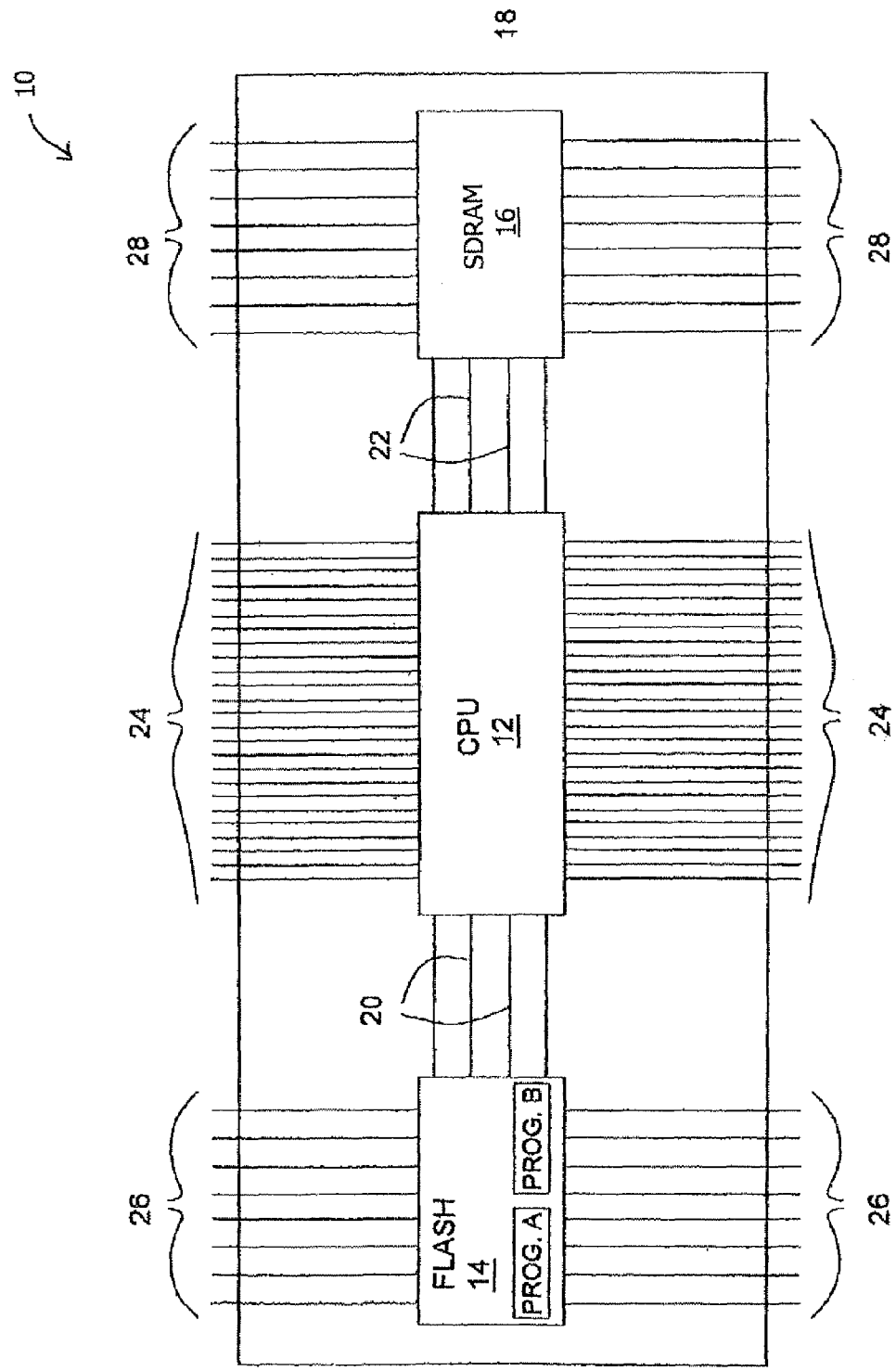

SYSTEM-IN-PACKAGE AND METHOD OF TESTING THEREOF

FIELD AND BACKGROUND OF THE INVENTION

The present invention relates to integrated circuit systems and, more particularly, to a method of testing a system-in-package and of a system-in-package whose simplified design is permitted by that method.

The advent of integrated circuits made it possible to fabricate an entire electronic circuit in a single package. Traditionally, such chips were packaged in separate packages, which then were connected together, for example after being mounted together on printed circuit boards, to form complete systems. More recently, in order to reduce the size of electronic systems further, some manufacturers have begun to package several chips, related to several technologies, in the same package. For example, a processor for controlling a cellular telephone could include a central processing unit (CPU), a nonvolatile memory such as a flash memory and a volatile memory such as a SDRAM, each fabricated on its own chip, and all packaged in the same package. Such a system is called a "System-in-Package" (SIP), a "MultiChip Package" (MCP) or a "MultiChip Module" (MCM).

The connection of the package to external electrical and electronic circuits is via the same kind of external connectors as are used with individually packaged chips. Common examples of such external connectors include legs, pins and solder balls. Of course, with more than one chip inside the package, the number of external connectors of a SIP is commensurately larger than the number of external connectors of an individually packaged chip. A SIP is tested much as an individually packaged chip is tested: by being mounted on a testing board, with testing pins connected to the external connectors of the SIP. Appropriate voltages are supplied to selected external connectors, and the responses of the SIP at the same external connectors or at other external connectors are observed. The disparate nature of the various chips inside a typical SIP creates problems that do not exist in the testing of individually packaged chips. For example, a CPU typically has many external connectors to test, but the time of the test is relatively short (several seconds). By contrast, a memory chip typically has a small number of external connectors to test, but the test may take upwards of ten minutes because each bit of the memory chip must be tested by writing to the bit and then reading the bit. In the case of individually packaged chips, relatively few CPUs can be tested simultaneously, but the test time is relatively short. Conversely, many individually packaged memory chips can be tested together, but the test time is relatively long. Nevertheless, the overall throughputs of individually packaged CPUs and individually packaged memory chips under test are similar. Testing a SIP that includes a CPU and one or more memory chips gets the worst of both worlds: the duration of the test is long, to accommodate the memories; but many testing pins must be provided to access for testing, not only the CPU and the memories, but also the internal connections that constitute the internal interface between the CPU and the memories.

Note that in order to enable the testing of the internal interface, a prior art SIP must include, in addition to the external connectors of the CPU and the memories, additional external connectors to the internal interface. Normally, the memories are tested via these additional external connectors. While the memories are being tested, the CPU is placed in an idle state so as not to interfere with the testing of the memories.

There is thus a widely recognized need for, and it would be highly advantageous to have, a method of testing SIPs that would overcome the disadvantages of presently known methods as described above

SUMMARY OF THE INVENTION

According to the present invention there is provided a method of testing an electronic device that includes a CPU and at least one memory, including the steps of: (a) testing the at least one memory, using the CPU; and (b) testing the CPU.

According to the present invention there is provided a method of testing an electronic device that includes a CPU, a nonvolatile memory and a volatile memory, including the steps of: (a) testing at least one of the memories, using the CPU; and (b) testing the CPU.

According to the present invention there is provided a method of testing a nonvolatile memory that is included in a system-in-package, including the steps of: (a) including a CPU in the system-in-package; (b) storing a testing program in the nonvolatile memory; and (c) executing the testing program, by the CPU, in order to test the nonvolatile memory.

According to the present invention there is provided an electronic device including: (a) a nonvolatile memory wherein is stored a first testing program for testing the nonvolatile memory; and (b) a volatile memory, operationally connected to the nonvolatile memory; and wherein a second program, for testing the volatile memory, is stored in the nonvolatile memory.

According to the present invention there is provided a method of testing a system-in-package that includes a nonvolatile memory and a volatile memory, including the steps of: (a) executing a first testing program in order to test the volatile memory; and (b) storing results of the executing in the nonvolatile memory.

The method of the present invention is directed towards the testing of an electronic device that includes a CPU and at least one memory. Typically, the device includes two memories: a nonvolatile memory and a volatile memory. The basic idea of the present invention is to use the CPU itself, rather than a conventional memory testing device, to test the memory or memories. The CPU is tested separately, substantially as in the prior art. Preferably, the CPU is tested after the memory or memories are tested.

Preferably, the testing of the memory or memories is effected by loading a testing program into the volatile memory and then having the CPU execute the testing program. More preferably, the testing program is stored in the nonvolatile memory, as part of the manufacture of the nonvolatile memory. Then, during testing, the testing program is loaded into the volatile memory from the nonvolatile memory, most preferably by the CPU. Alternatively, the testing program is loaded into the volatile memory from an external source.

As yet another alternative, the testing program is stored in the nonvolatile memory, as part of the manufacture of the nonvolatile memory, and is executed directly in the nonvolatile memory by the CPU to test the volatile memory.

Preferably, the results of the tests are stored in the nonvolatile memory. Most preferably, the results of the test then are read from the nonvolatile memory as part of the testing of the CPU.

Optionally, the testing of the memory or memories is done as part of a burn-in of the electronic device.

The scope of the present invention includes some aspects of the testing method described above that are independent of the testing, of the CPU. For example, according to the present invention, a testing program is stored in a nonvolatile memory of a SIP that also includes a CPU, and then the nonvolatile memory, is tested by having the CPU execute the testing program. Preferably, the testing program is first loaded from the nonvolatile memory, to a volatile memory, and then is executed in the volatile memory. Most preferably, the volatile memory also is included in the SIP. Preferably, the results of the testing are stored in the nonvolatile memory. Optionally, the testing program is executed during a burn-in of the nonvolatile memory.

Some such aspects of the present invention are independent of the use of the CPU to test the memories. For example, the scope of the present invention includes an electronic device that includes both a nonvolatile memory and a volatile memory that is operationally connected to the nonvolatile memory. A first testing program, for testing the nonvolatile memory, and also a second testing program, for testing the volatile memory, are stored in tile nonvolatile memory. Preferably, the nonvolatile memory and the volatile memory are fabricated as separate respective chips and are packaged together in a common package. Most preferably, the electronic device also includes, packaged together with the two memories in the common package, a CPU that is fabricated on its own respective chip and that is operationally connected to the nonvolatile memory and/or to the volatile memory.

Another example of an aspect of the present invention that is independent of the use of a CPU to test the memories is the testing of a volatile memory of a SIP by executing a first testing program in order to test the volatile memory, and then storing the results of the test in the nonvolatile memory of the SIP. Preferably, a second testing program is executed in order to test the nonvolatile memory, and the results of the second test also are stored in the nonvolatile memory. Optionally, the testing program is executed during a burn-in of the volatile memory.

BRIEF DESCRIPTION OF THE DRAWINGS

The invention is herein described, by way of example only, with reference to the accompanying drawings, wherein:

The sole FIGURE is a schematic illustration of a System-In-Package of the present invention.

DESCRIPTION OF THE PREFERRED EMBODIMENTS

The present invention is of a method of testing an electronic system such as a system-in-package (SIP), and of an SIP of a simplified design, compared to prior art SIPs. The simpler design of the SIP of the present invention is made possible by the method of the present invention.

The principles and operation of SIP testing according to the present invention may be better understood with reference to the drawings and the accompanying description.

Referring now to the drawings, the Figure is a schematic illustration of an SIP 10 of the present invention. SIP 10 includes three chips, a CPU chip 12, a nonvolatile memory chip 14 and a volatile memory chip 16. Specifically, nonvolatile memory chip 14 is a flash memory chip and volatile memory chip 16 is a SDRAM chip. Internal connectors 20 constitute an operational interface between CPU chip 12 and flash memory chip 14. Internal connectors 22 constitute an operational interface between CPU chip 12 and SDRAM chip 16. All three chips 12, 14 and 16 are packaged inside a common package 18. SIP 10 also may include other components, such as passive components, inside package 18 and operationally connected to one or more of chips 12, 14 or 16. For illustrational simplicity, these additional components are not shown.

Fifty external connectors 24 emerge from CPU chip 12 and extend outside of package 18 to enable connection of external circuits to CPU chip 12. Sixteen external connectors 26 emerge from flash chip 14 and extend outside of package 18 to enable connection of external circuits to flash chip 14. Sixteen external connectors 28 emerge from SDRAM chip 16 and extend outside of package 18 to enable connection of external circuits to SDRAM chip 16. The numbers of external connectors 24, 26 and 28 illustrated are at the low ends of the ranges that typically are used. A CPU chip typically has between thirty and three hundred external connectors; a nonvolatile memory chip typically has between fifteen and fifty external connectors; and a volatile memory chip typically also has between fifteen and fifty external connectors. A lower number than typical of external connectors is shown in the Figure for illustrational simplicity.

It is an important feature of SIP 10 that there are no external connectors directly to internal connectors 20 and 22. All the external connectors of SIP 10 connect external circuits directly to the respective chips of the external connectors. This reduces the cost of manufacturing SIP 10 because fewer external connectors are needed than in a similar SIP of the prior art.

Flash memory chip 14 is manufactured with two programs stored within: a program A for testing flash memory chip 14 itself and a program B for testing SDRAM chip 16.

Testing of SIP 10 is conducted in two phases. In the first phase. CPU chip 12 is used to test memory chips 14 and 16. This is in contrast to the prior art method, in which the testing of memory chips 14 and 16 would be independent of CPU chip 12. For this purpose, SIP 10 is mounted in a testing device that feeds only voltages and clock pulses to CPU chip 12: there is no need to put CPU 12 into an idle state because internal connectors 20 and 22 are not accessed directly by the testing device. First, CPU chip 12 loads program A from flash memory chip 14 into SDRAM chip 16, executes program A in SDRAM chip 16 to test flash memory chip 14, and stores the results of the test in flash memory chip 14 Second, CPU chip 12 loads program B from flash memory chip 14 into SDRAM chip 16, executes program B in SDRAM chip 16 to test SDRAM chip 16, and stores the results of the test in flash memory chip 14. Alternatively, if the flash memory of flash memory chip 14 is a random access flash memory such as a NOR flash memory, CPU chip 12 executes program B directly in flash memory chip 14 to test SDRAM chip 16, and stores the results of the test in flash memory chip 14. Preferably, the test results, as stored in flash memory chip 14, include data, such as tester number, lot numbers, production dates, testing dates and program versions, that may be relevant to future failure analysis.

In the second phase, SIP 10 is mounted on a conventional tester board for CPU chips 12 and tests CPU chip 12 substantially in the conventional manner. The most significant difference between a conventional test and the testing of CPU chip 12 according to the present invention is that the testing of CPU chip 12 according to the present invention includes reading out the results, of the first phase tests of memory chips 14 and 16, that were stored in flash memory chip 14.

As an alternative to storing the first phase test results in flash chip 14, or in addition to storing the first phase test results in flash chip 14, CPU chip 12 lights up a respective LED on the first phase testing device to indicate success or failure of one of memory chips 14 and 16. Another alternative or supplement to storing the first phase test results in flash chip 14 is to send the results to an external host computer via a suitable interface such as a USB interface.

For simplicity of exposition, the above discussion describes the testing of a single SIP 10. Preferably, the testing device of the first phase is configured so that as many as 100 SIPs 10 are tested simultaneously.

It will be clear to those skilled in the art that the method of the present invention, as described above, can be used to test, not just a SIP of the present invention, but also a similar prior art SIP. Because the method of the present invention uses the CPU chip of the SIP to test the memory chips of the SIP, external connectors to the interfaces between the CPU chip and the memory chips, which are present in a prior art SIP only for testing purposes anyway, are simply ignored. In addition, the programs for testing the memory chips of the SIP must be loaded to the volatile memory chip of the SIP from an external source, rather than read from the nonvolatile memory chip of the SIP; and the test results must be displayed or stored external to the SIP rather than being stored in the nonvolatile memory chip of the SIP.

The above discussion is for an ordinary test of SIP 10. The same principles apply to a burn-in test of memory chips 14 and 16 of SIP 10. The purpose of the test described above is to verify that SIP 10 meets its design specification under ordinary operating conditions. The purpose of the burn-in test is to identify and disable bad blocks of memory chips 14 and 16. Typically, the burn-in test is conducted with SIP held at a specified temperature outside the range of normal operating temperatures of SIP 10, to stress the memory blocks of SIP 10 so that marginal memory blocks fail. Typical testing temperatures are 70° C. (above the normal operating range) and −25° C. (below the normal operating range). For example, according to the present invention, a burn-in testing program is stored in flash memory chip 14 at the time of manufacture of flash memory chip 14. To identify the bad blocks of flash memory chip 14, CPU 12 copies this program to SDRAM chip 16 and executes this program in SDRAM chip 16. Under the direction of the program, CPU 12 applies burn-in voltages to flash memory chip 14 via internal connectors 20. Identifiers of the blocks of flash memory chip 14 that respond improperly to the burn-in voltages are recorded in flash memory chip 14, and these blocks are never used in the subsequent operation of SIP 10.

While the invention has been described with respect to a limited number of embodiments, it will be appreciated that many variations, modifications and other applications of the invention may be made.

What is claimed is:

1. A method of assembling and testing a system-in-package, comprising the steps of:
    (a) including a CPU in the system-in-package on a first chip;
    (b) including a nonvolatile memory in the system-in-package on a second chip that is physically independent of said first chip;
    (c) operationally connecting said CPU to said nonvolatile memory;
    (d) storing, in said nonvolatile memory, a program for testing said nonvolatile memory by steps including writing to said nonvolatile memory; and
    (e) executing said program, by said CPU, in order to test said nonvolatile memory.

2. The method of claim 1, further comprising the step of:
    (f) loading said program from said nonvolatile memory into a volatile memory, said executing of said program then being from said volatile memory.

3. The method of claim 2, further comprising the step of:
    (g) including said volatile memory in the system-in-package.

4. The method of claim 1, further comprising the step of:
    (f) storing results of said executing in said nonvolatile memory.

5. The method of claim 1, wherein said executing is effected during a burn-in of the nonvolatile memory.

6. The method of claim 1 wherein a single said CPU is included in the system-in-package.

7. The method of claim 1, wherein said program includes executable code.

* * * * *